US010833792B2

(12) United States Patent
Liu et al.

(10) Patent No.: US 10,833,792 B2
(45) Date of Patent: Nov. 10, 2020

(54) OVERLAPPED MULTIPLEXING-BASED MODULATION AND DEMODULATION METHOD AND DEVICE

(71) Applicant: Shenzhen Super Data Link Technology Ltd., Guangdong (CN)

(72) Inventors: Ruopeng Liu, Guangdong (CN); Chunlin Ji, Guangdong (CN); Hao Zheng, Guangdong (CN); Shasha Zhang, Guangdong (CN)

(73) Assignee: SHENZHEN KUANG-CHI HEZHONG TECHNOLOGY LTD, Shenzhen (CN)

( * ) Notice: Subject to any disclaimer, the term of this patent is extended or adjusted under 35 U.S.C. 154(b) by 0 days.

(21) Appl. No.: 16/379,744

(22) Filed: Apr. 9, 2019

(65) Prior Publication Data

US 2019/0238255 A1  Aug. 1, 2019

Related U.S. Application Data

(63) Continuation of application No. PCT/CN2017/091965, filed on Jul. 6, 2017.

(30) Foreign Application Priority Data

Oct. 10, 2016 (CN) .......................... 2016 1 0886202

(51) Int. Cl.
*H04J 99/00* (2009.01)
*H04L 27/32* (2006.01)
*H04L 1/00* (2006.01)

(52) U.S. Cl.
CPC ............... *H04J 15/00* (2013.01); *H04L 1/00* (2013.01); *H04L 27/32* (2013.01)

(58) Field of Classification Search
None
See application file for complete search history.

(56) References Cited

U.S. PATENT DOCUMENTS

| 2004/0221223 | A1* | 11/2004 | Yu ..................... H03M 13/116 714/800 |
| 2007/0202889 | A1* | 8/2007 | Kim ................. H03M 13/6362 455/456.1 |

(Continued)

FOREIGN PATENT DOCUMENTS

| CN | 101388672 A | 3/2009 |
| CN | 101431393 A | 5/2009 |

(Continued)

OTHER PUBLICATIONS

English Translation of International Search Report dated Sep. 28, 2017 for PCT Patent Application No. PCT/CN2017/091965 filed Jul. 6, 2017, 2 pages., dated Sep. 28, 2017.

(Continued)

*Primary Examiner* — Shripal K Khajuria
(74) *Attorney, Agent, or Firm* — Cantor Colburn LLP

(57) ABSTRACT

An overlapped multiplexing-based modulation and demodulation method and device are disclosed. In the modulation method, a precoding structure is used, and a transmit end first performs parity check product code-based coding on an input information sequence, generates a factor graph for a coding result and according to a coding rule, then performs overlapped multiplexing-based modulation and coding, and transmits a coded signal by using an antenna. In the demodulation method, a signal is transmitted by using a channel, and after receiving the signal by using an antenna, a receive end first performs digital signal processing, including processes such as synchronization and equalization, then performs overlapped multiplexing-based demodulation and decoding, and finally performs factor graph-based belief propagation (Continued)

decoding on a decoding result, to finally obtain a decoded sequence. In this application, a product code-based decoding method is used, a parity check code is used as a subcode, and a belief propagation idea of the factor graph is applied to a decoder end. Therefore, a parity check product code in a simple structure is used. In addition, in the method, the factor graph is used in a decoding process, thereby reducing operation complexity.

7 Claims, 13 Drawing Sheets

(56) References Cited

U.S. PATENT DOCUMENTS

| | | | |
|---|---|---|---|
| 2010/0077275 A1* | 3/2010 | Yu | H03M 13/116 |
| | | | 714/752 |
| 2012/0051208 A1* | 3/2012 | Li | H04J 13/0011 |
| | | | 370/208 |
| 2012/0159408 A1* | 6/2012 | Hershey | G06F 30/331 |
| | | | 716/104 |
| 2016/0269049 A1 | 9/2016 | Kim | |
| 2017/0366201 A1* | 12/2017 | Jain | H03M 13/616 |

FOREIGN PATENT DOCUMENTS

| | | |
|---|---|---|
| CN | 101557364 A | 10/2009 |
| EP | 3605898 A1 | 2/2020 |

OTHER PUBLICATIONS

Andres I Vila, "LDPC Decoders with Informed Dynamic Scheduling", IEE Translations on Communications, vol. 58, No. 12, Dec. 1, 2010, pp. 3470-3479, XP011340164.

European Search Report for corresponding application EP 17861120: Report dated May 20, 2020.

Japanese Office Action for Japanese Patent Application No. 2019-517838; dated Jun. 19, 2020.

Jun Deng et al, "A Programmable IP Core for LDPC Decoder Based on ASIP", 2011 IEE 9th International Conference, Oct. 25, 2011, pp. 764-767, XP032120531.

Korean Office Action for Korean Application 10-2019-7011049; dated May 29, 2020.

Xia Zhang, "Overlapped Time Division Multiplexing System Using Turbo Product Code", Wireless Communication Networking and Mobile Computing, Sep. 23, 2010, pp. 1-5, XP031828063.

* cited by examiner $$a_0x_0 \quad a_1x_0 \quad a_2x_0 \quad \cdots \quad a_{k-1}x_0$$

$$a_0x_1 \quad a_1x_1 \quad a_2x_1 \quad \cdots \quad a_{k-1}x_1$$

$$a_0x_2 \quad a_1x_2 \quad a_2x_2 \quad \cdots \quad a_{k-1}x_2$$

$$\cdots$$

$$a_0x_{k-1} \quad a_1x_{k-1} \quad a_2x_{k-1} \quad \cdots \quad a_{k-1}x_{k-1}$$

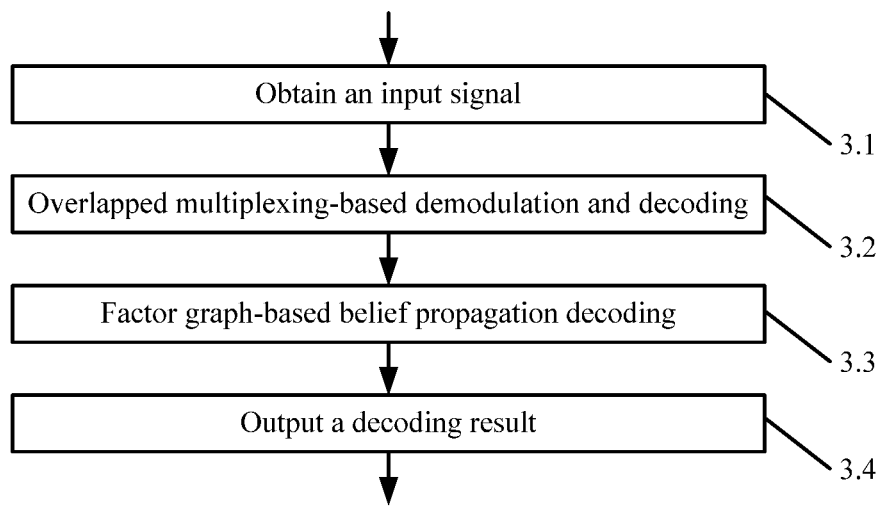

FIG. 15

```
          ↓
┌─────────────────────────────────────────────────────┐
│              Obtain an input signal                 │ ── 3.1
└─────────────────────────────────────────────────────┘
          ↓
┌─────────────────────────────────────────────────────┐
│  Overlapped multiplexing-based demodulation and decoding │ ── 3.2
└─────────────────────────────────────────────────────┘
          ↓
┌─────────────────────────────────────────────────────┐
│      Factor graph-based belief propagation decoding │ ── 3.3
└─────────────────────────────────────────────────────┘
          ↓
┌─────────────────────────────────────────────────────┐
│              Output a decoding result               │ ── 3.4
└─────────────────────────────────────────────────────┘
          ↓
```

FIG. 16

OVERLAPPED MULTIPLEXING-BASED MODULATION AND DEMODULATION METHOD AND DEVICE

CROSS-REFERENCE TO RELATED APPLICATIONS

This application is a continuation application of PCT/CN2017/091965, filed Jul. 6, 2017, published as WO 2018/068540, which claims the priority of Chinese Application No. 201610886202.X, filed Oct. 10, 2016. The contents of the above-identified applications are incorporated herein by reference in their entireties.

TECHNICAL FIELD

This application relates to the communications field, and in particular, to an overlapped multiplexing-based modulation and demodulation method and device.

BACKGROUND

A modulation and demodulation technology based on overlapped multiplexing (OvXDM: Overlapped X Division Multiplexing) includes a plurality of specific implementation solutions, for example, a modulation and demodulation technology based on overlapped time division multiplexing (OvTDM: Overlapped Time Division Multiplexing), a modulation and demodulation technology based on overlapped frequency division multiplexing (OvFDM: Overlapped Frequency Division Multiplexing), a modulation and demodulation technology based on overlapped code division multiplexing (OvCDM: Overlapped Code Division Multiplexing), a modulation and demodulation technology based on overlapped space division multiplexing (OvSDM: Overlapped Space Division Multiplexing), and a modulation and demodulation technology based on overlapped hybrid division multiplexing (OvHDM: Overlapped Hybrid Division Multiplexing).

It should be noted that in OvXDM mentioned in this application, X represents any domain, for example, time T, space S, frequency F, code C, and hybrid H.

The following provides brief description by using OvTDM as an example.

First, time division (hereinafter referred to as TD) multiplexing (TDM: Time Division Multiplexing) is a technology in which a plurality of signal symbols occupying relatively narrow time durations share one relatively wide time duration in digital communication. FIG. 1 is a schematic diagram of a conventional time division multiplexing technology.

In FIG. 1, time durations (referred to as timeslot widths in engineering) of multiplexed signal symbols are respectively T1, T2, T3, T4, . . . , and in engineering, the signal symbols usually occupy a same timeslot bandwidth. ΔT is a minimum guard timeslot, and an actual guard timeslot width should be larger. ΔT should be greater than a sum of a transition time width of a used demultiplexing gate circuit and a maximum time jitter of a system. This is a most common time division multiplexing technology. This technology is used in most existing systems such as multichannel digital broadcast systems and multichannel digital communications systems.

A most significant feature of this technology when it is applied to digital communications is: Multiplexed signal symbols are fully isolated from each other in terms of time, without mutual interference. The multiplexed signal symbols are not limited, and symbol durations (timeslot widths) of signals may have different widths. In addition, this technology is applicable to different communications mechanisms, provided that timeslots of the multiplexed signal symbols do not overlap or cross with each other. Therefore, this technology is most widely used. However, such multiplexing has no effect in improving spectral efficiency of a system.

Therefore, a conventional idea is that adjacent channels do not overlap in time domain, to avoid interference between the adjacent channels. However, this technology limits improvement of spectral efficiency. An idea of a time division multiplexing technology in the prior art is that channels do not need to be isolated from each other and may strongly overlap with each other. As shown in FIG. 2, in the prior art, overlapping between channels is considered as a new coding constraint relationship, and corresponding modulation and demodulation technologies are proposed based on the constraint relationship. Therefore, a technology is referred to as overlapped time division multiplexing (OvTDM: Overlapped Time Division Multiplexing). In this technology, spectral efficiency increases proportionally with a quantity K of times of overlapping.

Referring to FIG. 3, an overlapped time division multiplexing system includes a transmitter A01 and a receiver A02.

The transmitter A01 includes an overlapped time division multiplexing-based modulation device 101 and a transmission device 102. The overlapped time division multiplexing-based modulation device 101 is configured to generate a complex modulated envelope waveform carrying an input signal sequence. The transmission device 102 is configured to transmit the complex modulated envelope waveform to the receiver A02.

The receiver A02 includes a receiving device 201 and a sequence detection device 202. The receiving device 201 is configured to receive the complex modulated envelope waveform transmitted by the transmission device 102. The sequence detection device 202 is configured to perform data sequence detection on the received complex modulated envelope waveform in time domain, to perform decision output.

Usually, the receiver A02 further includes a preprocessing device 203 between the receiving device 201 and the sequence detection device 202, configured to assist in forming a synchronously received digital signal sequence in each frame.

In the transmitter A01, the input digital signal sequence forms, by using the overlapped time division multiplexing-based modulation device 101, transmit signals that have a plurality of symbols overlapped in time domain; and then the transmission device 102 transmits the transmit signals to the receiver A02. The receiving device 201 of the receiver A02 receives the signals transmitted by the transmission device 102. The signals form, by using the preprocessing device 203, digital signals suitable for the sequence detection device 202 to detect and receive. The sequence detection device 202 performs data sequence detection on the received signals in time domain, to output a decision.

Referring to FIG. 4, the overlapped time division multiplexing-based modulation device 101 (OvTDM modulation device) includes a waveform generation module 301, a shift module 302, a multiplication module 303, and a superimposition module 304.

The waveform generation module 301 is configured to generate, based on a design parameter, an initial envelope waveform whose waveform is smooth in time domain.

The shift module 302 is configured to shift the initial envelope waveform in time domain at a preset shift interval based on a quantity of times of overlapped multiplexing, to obtain shifted envelope waveforms at fixed intervals.

The modulation module 305 is configured to convert an input digital signal sequence into a signal symbol sequence represented by using positive and negative symbols.

The multiplication module 303 is configured to multiply the signal symbol sequence by offset shifted envelope waveforms at fixed intervals, to obtain modulated envelope waveforms.

The superimposition module 304 is configured to superimpose the modulated envelope waveforms in time domain, to obtain a complex modulated envelope waveform carrying the input signal sequence.

FIG. 5 is a block diagram of the preprocessing device 203 of the receiver A02.

The preprocessing device 203 includes a synchronizer 501, a channel estimator 502, and a digital processor 503. The synchronizer 501 implements symbol time synchronization of received signals in the receiver. Next, the channel estimator 502 estimates a channel parameter. The digital processor 503 performs digital processing on received signals in each frame, to form a digital signal sequence suitable for the sequence detection device to perform sequence detection and receive.

FIG. 6 is a block diagram of the sequence detection device 202 of the receiver A02.

The sequence detection device 202 includes an analysis unit memory 601, a comparator 602, and a plurality of retained path memories 603 and Euclidean distance memories 604 or weighted Euclidean distance memories (not shown in the figure). In a detection process, the analysis unit memory 601 makes a complex convolutional coding model and a trellis diagram of the overlapped time division multiplexing system, and lists and stores all states of the overlapped time division multiplexing system; the comparator 602 finds, based on the trellis diagram in the analysis unit memory 601, a path with a minimum Euclidean distance or a weighted minimum Euclidean distance to a received digital signal; and the retained path memories 603 and the Euclidean distance memories 604 or the weighted Euclidean distance memories are respectively configured to store a retained path and an Euclidean distance or a weighted Euclidean distance that are output by the comparator 602. One retained path memory 603 and one Euclidean distance memory 604 or weighted Euclidean distance memory need to be prepared for each stable state. Preferably, a length of the retained path memory 603 may be 4K-5K. Preferably, the Euclidean distance memory 604 or the weighted Euclidean distance memory stores only a relative distance.

In an OvXDM system, a signal transmitter modulates a signal and then sends a modulated signal to a signal receiver, and the signal receiver demodulates the modulated signal after receiving it. A demodulation process includes a decoding step (that is, the sequence detection step performed by the foregoing sequence detection device). In a conventional communications system, a Chase algorithm is used for decoding in most cases. The algorithm involves massive sorting operations, and a computation amount is very large.

SUMMARY

This application provides an overlapped multiplexing-based modulation and demodulation method and device, so as to resolve a problem in conventional decoding that a Chase algorithm is used for decoding in most cases, a process of the algorithm involves massive sorting operations, and therefore computation complexity is relatively high.

According to a first aspect of this application, this application provides an overlapped multiplexing-based modulation method, including:

obtaining input information;

performing parity check product code-based coding on the input information, to generate a factor graph;

performing overlapped multiplexing-based modulation and coding; and transmitting a coded signal.

According to a second aspect of this application, this application further provides an overlapped multiplexing-based demodulation method, including:

obtaining an input signal;

performing overlapped multiplexing-based demodulation and decoding on the input signal;

performing factor graph-based belief propagation decoding; and outputting a decoding result.

According to a third aspect of this application, this application further provides an overlapped multiplexing-based modulation device, including:

an input information obtaining module, configured to obtain input information;

a parity check product code-based coding module, configured to perform parity check product code-based coding on the input information;

an overlapped multiplexing-based modulation and coding module, configured to perform overlapped multiplexing-based modulation and coding; and a signal transmission module, configured to transmit a coded signal.

In an embodiment, the parity check product code-based coding module includes: an information bit filling unit, configured to fill the input information into information bits in a coding structure, where specifically, the information bit filling unit is configured to write an input information sequent into corresponding information bits according to a $k_c \times k_r$ two-dimensional structure, where a length of the input information is $N=k_c \times k_r$, where $k_r$ represents a quantity of rows, and $k_c$ represents a quantity of columns;

a row coding unit, configured to perform row coding on the information in the information bits, where specifically, the row coding unit is configured to perform row coding by assuming that information in the $(k_r+1)^{th}$ bit of each row is a modulo-2 addition result of the first $k_c^{th}$ columns of the current row;

a column coding unit, configured to perform column coding on the information in the information bits, where specifically, the column coding unit is configured to perform column coding by assuming that information in the $(k_c+1)^{th}$ bit of each column is a modulo-2 addition result of the first $k_r^{th}$ rows of the current column; and a factor graph generation unit, configured to generate a factor graph for a coding result according to a coding rule.

In an embodiment, the coding structure is a diagonal coding structure, a two-dimensional coding structure, a three-dimensional coding structure, or a four-dimensional coding structure.

According to a fourth aspect of this application, this application further provides an overlapped multiplexing-based demodulation device, including:

an input signal obtaining module, configured to obtain an input signal;

an overlapped multiplexing-based demodulation and decoding module, configured to perform overlapped multiplexing-based demodulation and decoding on the input signal;

a factor graph-based belief propagation decoding module, configured to perform factor graph-based belief propagation decoding; and a decoding result output module, configured to output a decoding result.

In an embodiment, the factor graph-based belief propagation decoding module includes:

an initial log-likelihood ratio calculation unit, configured to calculate an initial log-likelihood ratio;

a maximum-quantity-of-iterations setting unit, configured to set a maximum quantity of iterations;

a check information update unit, configured to calculate a check node and update check information;

an information message update unit, configured to calculate a variable node and update an information message;

a log-likelihood ratio update unit, configured to calculate a log-likelihood ratio when all check nodes related to information bits provide information;

a decision unit, configured to perform decision on an information sequence; and a decoding result output unit, configured to output the decoding result after a specific preset condition is satisfied.

In an embodiment, the check information update unit is configured to calculate the check node by using a formula $$\delta_{ij} = 2\tanh^{-1}\left(\prod_{j' \in N(i)\backslash j} \tanh(\lambda_{j'i}/2)\right) \text{ or } \delta_{ij} = \min(|\lambda_{j'i}|)\left(\prod_{j' \in N(i)\backslash j} \text{sign}(\lambda_{j'i})\right),$$

and update the check information, where $\delta_{ij}$ is the check information, and represents a log-likelihood ratio when other variable nodes except the $j^{th}$ variable node provide information; $\lambda_{j'i}$ is the information message, and represents a log-likelihood ratio when other check nodes except the $i^{th}$ check node provide information; N(i) is a partial element information set constrained by the check node; N(i)/j represents a subset of N(i) that does not include the $j^{th}$ variable node; and Π is a continuous multiplication operation; and/or the preset condition is that the maximum quantity of iterations is reached.

In an embodiment, the information message update unit is configured to: calculate the variable node by using a formula $$\lambda_{ji} = llr(x_j) + \sum_{i' \in M(j)\backslash i} \delta_{i'j},$$

and update the information message; and calculate the log-likelihood ratio when all the check nodes related to the information bits provide information by using a formula $$\lambda_j = llr(x_j) + \sum_{i' \in M(j)} \delta_{i'j},$$

where $x_j$ is a transmit codeword in a transmit signal of a transmitter; $y_j$ is a receive codeword in the input signal received by a receiver; M(j) is a check set in which the variable node participates; M(j)\i represents a subset of the M(j) that does not include the $i^{th}$ check node; $\delta i'j$ is the check information, and represents a log-likelihood ratio when other variable nodes except the $j^{th}$ variable node provide information; $llr(x_j)$ is a representation form of a log-likelihood ratio when the receiver initially receives channel information; $\lambda_{ji}$ is the information message, and represents a log-likelihood ratio when other check nodes except the $i^{th}$ check node provide information; and $\lambda_j$ represents the log-likelihood ratio when all the check nodes related to the information bits provide information.

This application provides the overlapped multiplexing-based modulation and demodulation method and device. In the modulation method, a precoding structure is used, and a transmit end first performs parity check product code-based coding on an input information sequence, generates a factor graph for a coding result and according to a coding rule, then performs overlapped multiplexing-based modulation and coding, and transmits a coded signal by using an antenna. In the demodulation method, a signal is transmitted by using a channel, and after receiving the signal by using an antenna, a receive end first performs digital signal processing, including processes such as synchronization and equalization, then performs overlapped multiplexing-based demodulation and decoding, and finally performs factor graph-based belief propagation decoding on a decoding result, to finally obtain a decoded sequence. In this application, a product code-based decoding method is used, a parity check code is used as a subcode, and a belief propagation idea of the factor graph is applied to a decoder end. Therefore, a parity check product code in a simple structure is used. In addition, in the method, the factor graph is used in a decoding process, thereby reducing operation complexity.

BRIEF DESCRIPTION OF DRAWINGS

FIG. 15 is a schematic principle diagram of a symbol superimposition process of K waveforms;

FIG. 16 is a schematic flowchart of an overlapped multiplexing-based demodulation method according to an embodiment of this application;

DESCRIPTION OF EMBODIMENTS

Figure 1:
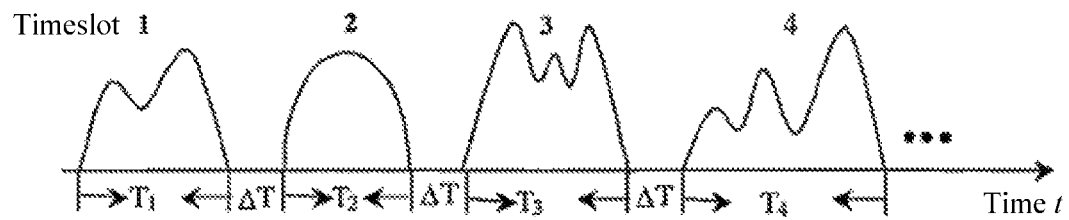
FIG. 1 is a schematic diagram of a conventional time division multiplexing technology.
Figure 2:
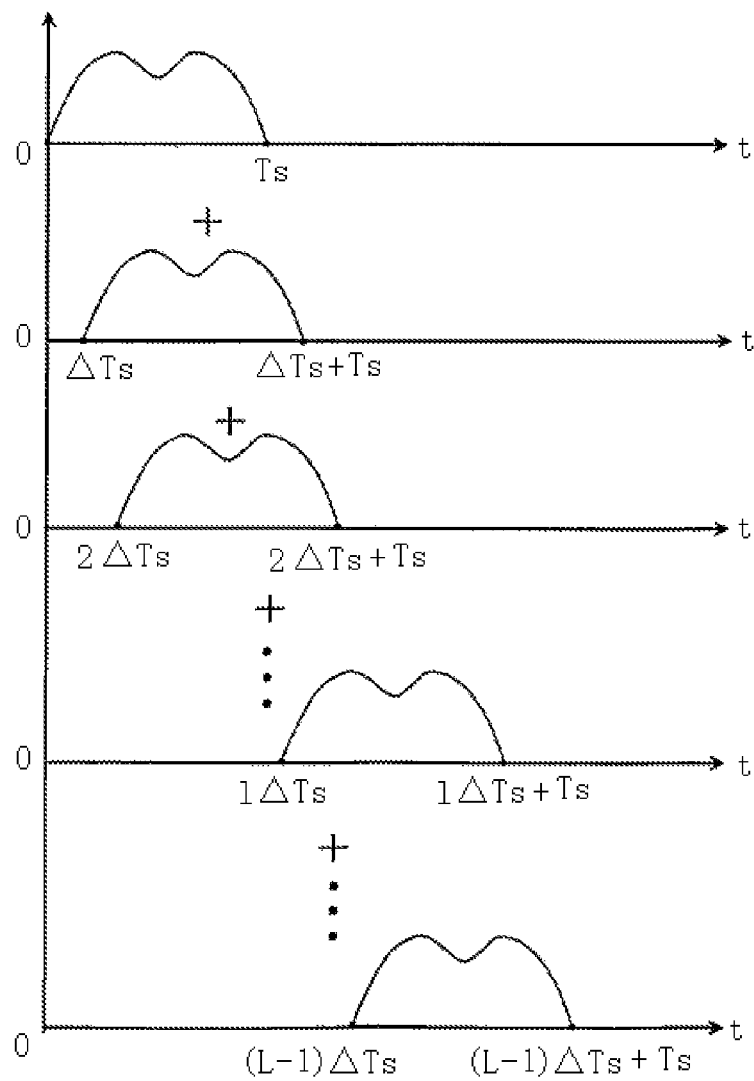
FIG. 2 is a schematic diagram of an overlapped time division multiplexing principle.
Figure 3:
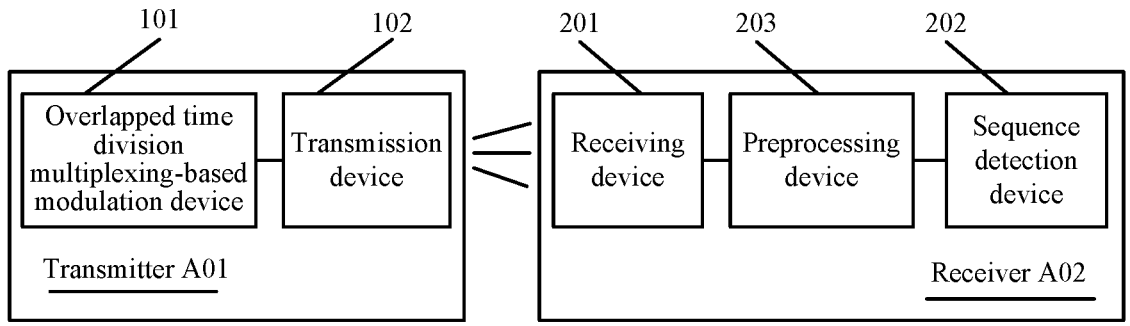
FIG. 3 is a schematic structural diagram of an overlapped time division multiplexing system.

First, it should be noted that, in an overlapped multiplexing (OvXDM)-based modulation and demodulation method and device provided in this application, X represents any domain, for example, time T, space S, frequency F, code C, and hybrid H. For ease of description, embodiments of this application are mainly described by using overlapped time division multiplexing (OvTDM) and overlapped frequency division multiplexing (OvFDM) as examples. Persons skilled in the art should know that the modulation and demodulation method and device protected by the claims of this application may also be applied to overlapped multiplexing technologies in other domains.

In an OvXDM system, a signal transmitter modulates a signal and then sends a modulated signal to a signal receiver, and the signal receiver demodulates the modulated signal after receiving it. A demodulation process includes a decoding step. During research on overlapped multiplexing-based modulation and demodulation technologies, persons skilled in the art use conventional decoding methods. In the conventional decoding methods, a Chase algorithm is used in most cases. The algorithm involves massive sorting operations, and a computation amount is very large.

Although the existing decoding methods have the foregoing problem, because these methods have been widely used, persons skilled in the art have fully accepted the methods, without taking efforts to look for a better method.

In an OvXDM (X represents time T, frequency F, space S, code C, hybrid H, or the like) system, an entire process usually ends after a receive end completes waveform decoding. In a relatively complex case, the OvXDM system is used together with a common conventional communications technology, for example, a concatenated OvXDM system or a precoding OvXDM system, to improve overall system performance. However, an error correction code has a relatively good error correction capability, and can improve overall system performance and reduce a bit error rate. Therefore, the error correction code is applied to the OvXDM system in most cases.

A product code is an error correction code in a block structure. In the product code, an idea of an iteration is introduced to a decoder end, to construct a currently popular Turbo product code. This is TPC-based coding. This type of coding is very widely used in existing communications systems. In a conventional communications system, a Chase algorithm is used for decoding in most cases. The algorithm involves massive sorting operations, and a computation amount is very large.

In the product code proposed in this application, a very simple parity check code is used as a subcode, and code length control and adaptation can be performed very flexibly and conveniently. At the decoder end, an iterative decoding method based on a belief propagation idea of a factor graph is used, and an operation is flexible and simple. In this application, the decoding idea based on belief propagation of a factor graph is introduced into a decoding method based on a parity check product code.

Figure 7:
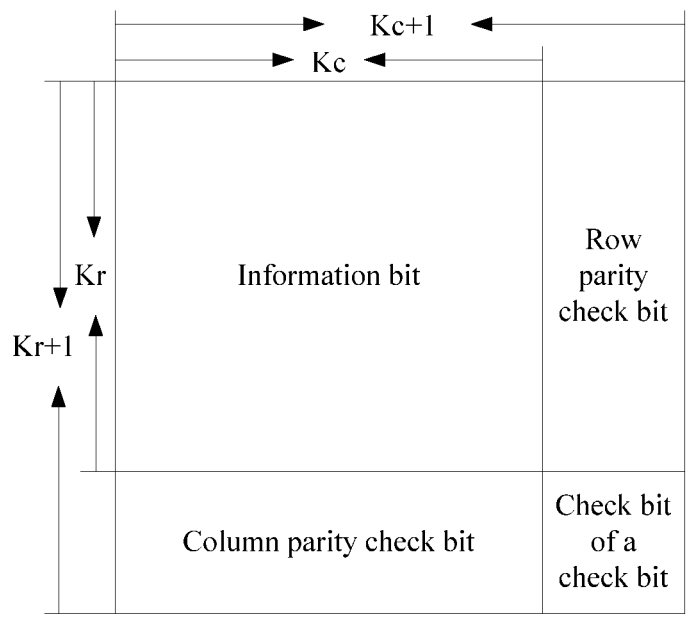
FIG. 7 is a structural diagram of a parity check product code according to an embodiment of this application.

Commonly used error correction codes include a product code (Turbo Product Code, TPC) and a low density parity check code (Low Density Parity Check Code, LDPC). In this application, a parity check product code is used as an example. A coding structure of the parity check product code is shown in FIG. 7. The coding structure is very simple, and a same code length may be selected for row and column subcodes.

Figure 8:
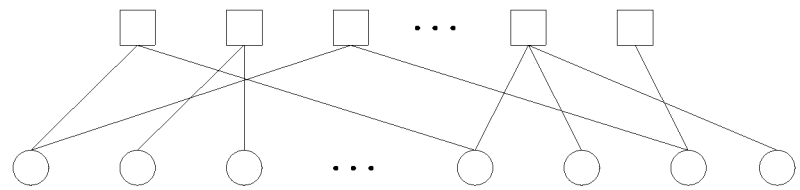
FIG. 8 is a two-way transfer factor graph according to an embodiment of this application.
Figure 9:
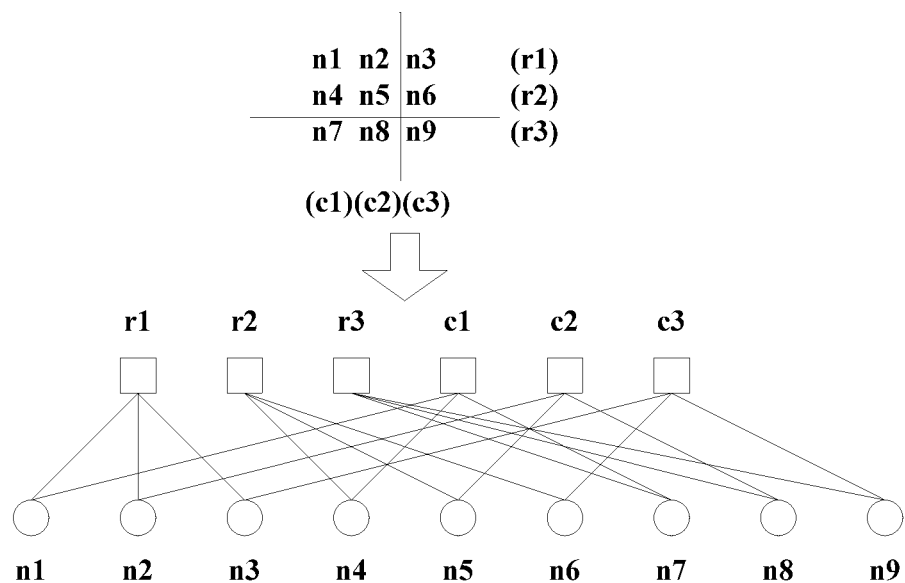
FIG. 9 is a schematic diagram of a correspondence between a parity check product code matrix and a factor graph according to an embodiment of this application.

According this coding structure, a factor graph is obtained in coding relatively easily, as shown in FIG. 8. Nodes shown in a lower part of the figure are variable nodes, and a quantity is a code length in a coding matrix block. Nodes shown in an upper part of the figure are check nodes, and a quantity is a length of a check bit. When the coding structure is applied to the OvXDM system, a relationship between a corresponding coding matrix and a two-way factor graph is shown in FIG. 9. In a related factor graph constructed in the parity check product code, it can be found that the factor graph has a relatively large girth, is relatively applicable to decoding by using a belief propagation method. During belief propagation decoding, a message may be propagated by using an operation in log domain.

The following further describes this application in detail with reference to specific embodiments and accompanying drawings.

Embodiment 1

Figure 10:
FIG. 10 is a block diagram of a transmit end in a precoding OvXDM system according to an embodiment of this application.

In this embodiment, it is assumed that an input information sequence is x, an information length is $N=k_c \times k_r=100$, $k_c=10$, $k_r=10$, and a quantity of times of overlapping is K=5, and an example is used, in which a multiplexing waveform is a Chebyshev window, a modulation scheme is BPSK, and a TPC error correction code is used for precoding. Using a precoding structure shown in FIG. 10, a system processing process is: A transmit end first performs TPC-based coding on an input information sequence, then performs OvXDM-based coding, and transmits a coded signal by using an antenna. The signal is transmitted in a channel After receiving the signal by using an antenna, a receive end first performs digital signal processing, including processes such as synchronization and equalization; then performs OvXDM-based decoding; and finally performs TPC-based decoding on a decoding result, that is, by using a factor graph-based belief propagation decoding method in this application, to finally obtain a decoded sequence x'.

Commonly used OvXDM (X represents time T, frequency F, space S, code C, hybrid H, or the like)-based decoding includes a maximum likelihood sequence decoding algorithm such as Viterbi decoding, and a maximum posterior probability algorithm such as a BCJR algorithm, a MAP algorithm, or a Log_MAP algorithm. The following mainly describes a parity check product code-based coding process and a corresponding factor graph-based belief propagation decoding method.

First, variables used in this embodiment are defined. It is assumed that $x_j$ is a transmit codeword, and $y_j$ is a receive codeword.

N(i): a partial element information set constrained by a check node, where N(i)\j represents a subset of N(i) that does not include the $j^{th}$ variable node.

M(j): a check set in which a variable node participates, where M(j)\i represents a subset of M(j) that does not include the $i^{th}$ check node.

llr($x_j$): a representation form of a log-likelihood ratio when channel information is initially received.

$\lambda_{ji}$: an information message, representing a log-likelihood ratio when other check nodes except the $i^{th}$ check node provide information.

$\lambda_j$: an information message, representing a log-likelihood ratio when all check nodes related to information bits provide information.

$\delta_{ij}$: check information, representing a log-likelihood ratio when other variable nodes except the $j^{th}$ variable node provide information.

Figure 4:
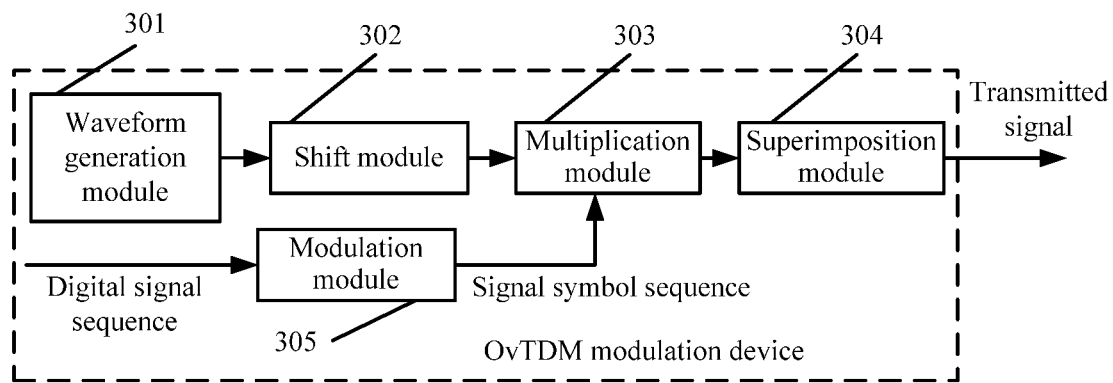
FIG. 4 is a schematic structural diagram of an overlapped time division multiplexing-based modulation device.
Figure 5:
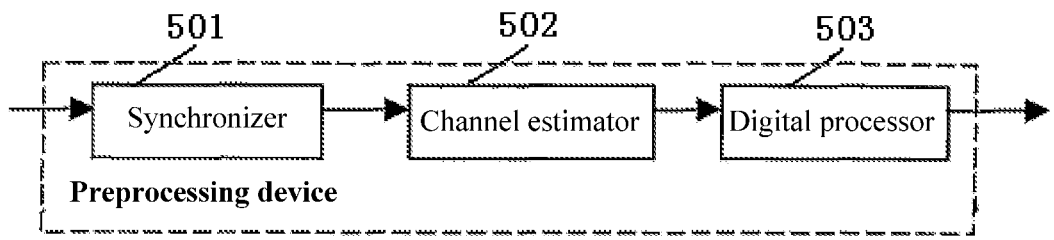
FIG. 5 is a schematic structural diagram of a preprocessing device of a receiver.
Figure 6:
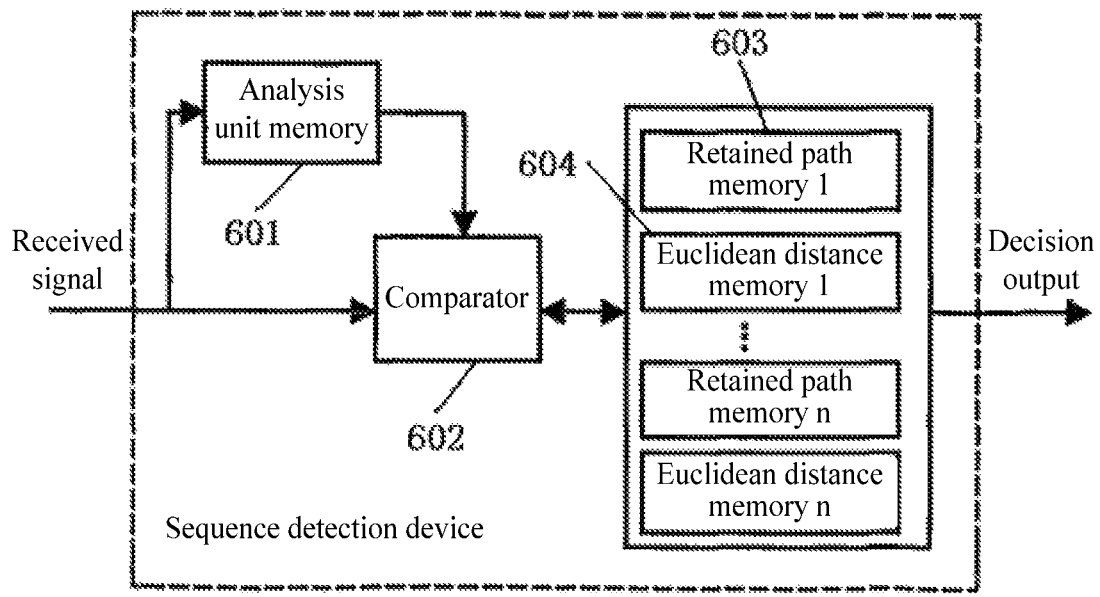
FIG. 6 is a schematic structural diagram of a sequence detection device of a receiver.
Figure 11:
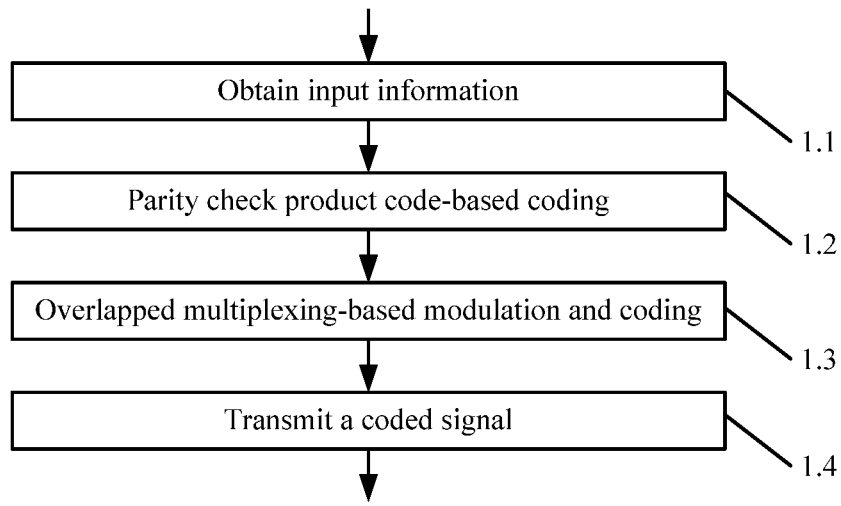
FIG. 11 is a schematic flowchart of an overlapped multiplexing-based modulation method according to an embodiment of this application.

Referring to FIG. 11, this embodiment provides an overlapped multiplexing-based modulation method, including the following steps:

Step 1.1: Obtain input information. The input information is the input digital signal sequence in FIG. 4.

Step 1.2: Perform parity check product code-based coding on the input information.

Step 1.3: Perform overlapped multiplexing-based modulation and coding.

Step 1.4: Transmit a coded signal, that is, transmit, to a receive end, a complex modulated envelope waveform generated in FIG. 4 as a transmit signal.

Figure 12:
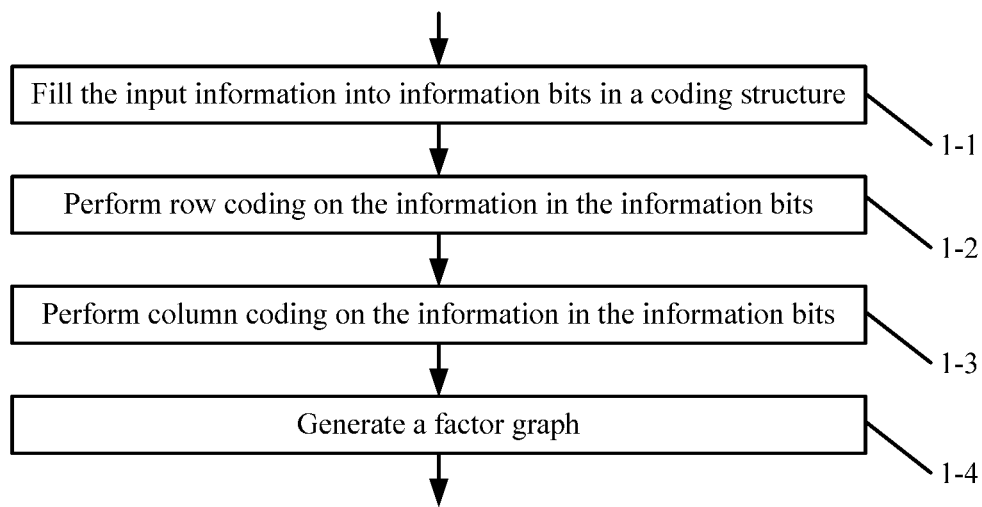
FIG. 12 is a schematic flowchart of a parity check product code-based coding step in an overlapped multiplexing-based modulation method according to an embodiment of this application.

Referring to FIG. 12, step 1.2 includes the following substeps:

Substep 1-1: Fill the input information into information bits in a coding structure. The coding structure may be a diagonal coding structure, a two-dimensional coding structure, a three-dimensional coding structure, or four-dimensional coding structure, or a higher-dimensional coding structure. This embodiment is described by using the two-dimensional coding structure as an example.

Specifically, an input information sequence is written into corresponding information bits according to a two-dimensional $k_c \times k_r$ structure, where $k_r$ represents a quantity of rows, and $k_c$ represents a quantity of columns.

Substep 1-2: Perform row coding on the information in the information bits.

Specifically, row coding is performed by assuming that information in the $(k_r+1)^{th}$ bit of each row is a modulo-2 addition result of the first $k_c^{th}$ columns of the current row.

Substep 1-3: Perform column coding on the information in the information bits.

Specifically, column coding is performed by assuming that information in the $(k_c+1)^{th}$ bit of each column is a modulo-2 addition result of the first $k_r^{th}$ rows of the current column.

A size of matrix obtained after coding is $(k_c+1) \times (k_r+1)$. A TPC code rate thereof is $$\text{Rate} = \frac{k_c \times k_r}{(k_c + 1) \times (k_r + 1)},$$

and is 0.8264 in this embodiment.

Substep 1-4: Generate a factor graph for a coding result according to a coding rule.

Figures 13, 14:
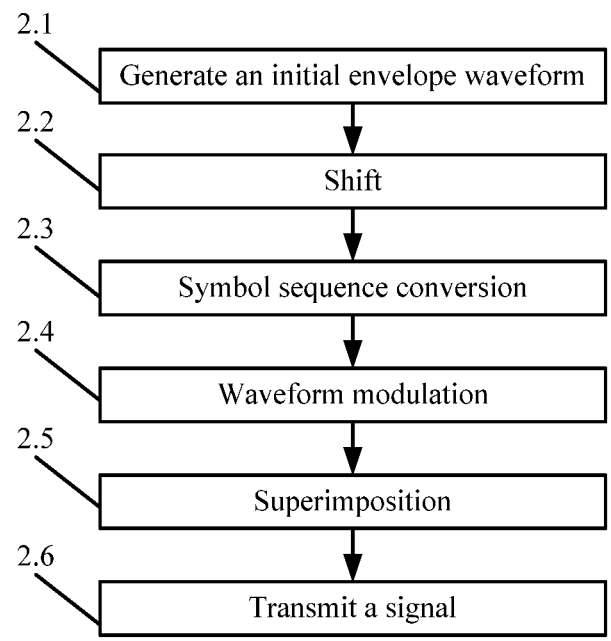
FIG. 13 is a schematic flowchart of a overlapped multiplexing-based modulation and coding step in an overlapped multiplexing-based modulation method according to an embodiment of this application.
FIG. 14 is a schematic principle diagram of multiplexing of K waveforms.

As shown in FIG. 13, step 1.3 includes the following substeps:

Substep 2.1: Generate an initial envelope waveform h(t) in time domain based on a design parameter.

During generation of the initial envelope waveform, a user may enter the design parameter, to implement flexible configuration in an actual system based on a system performance indicator.

In some embodiments, when side lobe attenuation of the initial envelope waveform has been determined, the design parameter includes a window length L of the initial envelope waveform, for example, when the initial envelope waveform is a Bartlett envelope waveform.

In some embodiments, the design parameter includes a window length L and side lobe attenuation r of the initial envelope waveform, for example, when the initial envelope waveform is a Chebyshev envelope waveform.

Certainly, when the initial envelope waveform is in another form, the design parameter may be determined based on characteristics of the corresponding initial envelope waveform.

Substep 2.2: Shift the initial envelope waveform in a corresponding domain (time domain in this embodiment) based on a quantity K of times of overlapped multiplexing and a preset shift interval, to obtain shifted envelope waveforms h(t−i*ΔT) at fixed intervals.

The shift interval is a time interval ΔT, and the time interval ΔT is: ΔT=L/K. In this case, a symbol width of a signal is ΔT.

In addition, it further needs to be ensured that ΔT is not less than a reciprocal of a system sampling rate.

A value of i is related to an input symbol length N, and i is an integer from 0 to N−1. For example, when N=8, i is an integer from 0 to 7.

Substep 2.3: Convert a digital signal sequence obtained after coding in step 1.2 into a signal symbol sequence represented by using positive and negative symbols.

Specifically, 0 and 1 in the digital signal sequence are converted into +A and −A respectively, to obtain the positive-negative symbol sequence, where a value of A is any non-zero number. For example, when A is 1, an input {0, 1} bit sequence is converted into a {+1, −1} symbol sequence through BPSK (binary phase shift keying) modulation.

Substep 2.4: Multiply the signal symbol sequence $x_i$ (in this embodiment, $x_i$={+1 +1 −1 −1 −1 +1 −1 +1}) obtained after conversion by the shifted envelope waveforms h(t−i*ΔT) at fixed intervals, to obtain modulated envelope waveforms $x_i$ h(t−i*ΔT).

Substep 2.5: Superimpose the modulated envelope waveforms $x_i$ h(t−i*ΔT) in the corresponding domain (time domain in this embodiment), to obtain a complex modulated envelope waveform carrying the input signal sequence, namely, a transmitted signal.

The transmitted signal may be represented as $$s(t) = \sum_i x_i h(t - i \times \Delta T).$$

The transmitting a coded signal in step 1.4 means: transmitting the obtained complex modulated envelope waveform as the transmit signal.

Therefore, in this embodiment, when the value of A is 1, output signals (the output signal symbol sequence) obtained after superimposition are: s(t)={+1 +2 +1 −1 −3 −1 −1 +1}.

Referring to FIG. 14, FIG. 14 is a schematic principle diagram of multiplexing of K waveforms. The diagram is in a shape of a parallelogram. Each row represents a to-be-sent signal waveform $x_i h(t-i^*\Delta T)$ obtained after a to-be-sent symbol $x_i$ is multiplied by an envelope waveform $h(t-i^*\Delta T)$ of a corresponding moment. $a_0$ to $a_{k-1}$ represent a coefficient value of each part obtained after each window function waveform (an envelope waveform) is segmented for K times, and are specifically a coefficient related to an amplitude.

When the input digital signal sequence is converted into the positive-negative symbol sequence, 0 and 1 in the input digital signal sequence are converted into ±A, to obtain the positive-negative symbol sequence, where the value of A is any non-zero number. For example, when the value of A is 1, the input {0, 1} bit sequence is converted into the {+1, −1} symbol sequence through BPSK modulation, to obtain the positive-negative symbol sequence. Therefore, FIG. 15 is a schematic principle diagram of a symbol superimposition process of K waveforms. In the superimposition process in FIG. 15, left three numbers in the first row represent the first input symbol +1, left three numbers in the second row represent the second input symbol +1, left three numbers in the third row represent the third input symbol −1, middle three numbers in the first row represent the fourth input symbol −1, middle three numbers in the second row represent the fifth input symbol −1, middle three numbers in the third row represent the sixth input symbol +1, right three numbers in the first row represent the seventh input symbol −1, and right three numbers in the second row represent the eighth input symbol +1. Therefore, after three waveforms are superimposed, obtained output symbols are {+1 +2 +1 −1 −3 −1 −1 +1}.

Certainly, if the input symbol length is another value, superimposition may be performed based on the manner shown in FIG. 14 and FIG. 15, to obtain output symbols.

It should be noted that, in step 1.3, overlapped multiplexing-based modulation and coding may also be performed by using any feasible method in the prior art, in addition to the foregoing method.

Embodiment 2

Based on the overlapped multiplexing-based modulation method provided in Embodiment 1, this embodiment correspondingly provides an overlapped multiplexing-based demodulation method. Referring to FIG. 16, the overlapped multiplexing-based demodulation method includes the following steps:

Step 3.1: Obtain an input signal. The input signal is the complex modulated envelope waveform signal transmitted in FIG. 4.

Step 3.2: Perform overlapped multiplexing-based demodulation and decoding on the input signal.

Step 3.3: Perform factor graph-based belief propagation decoding.

Step 3.4: Output a decoding result.

Figure 17:
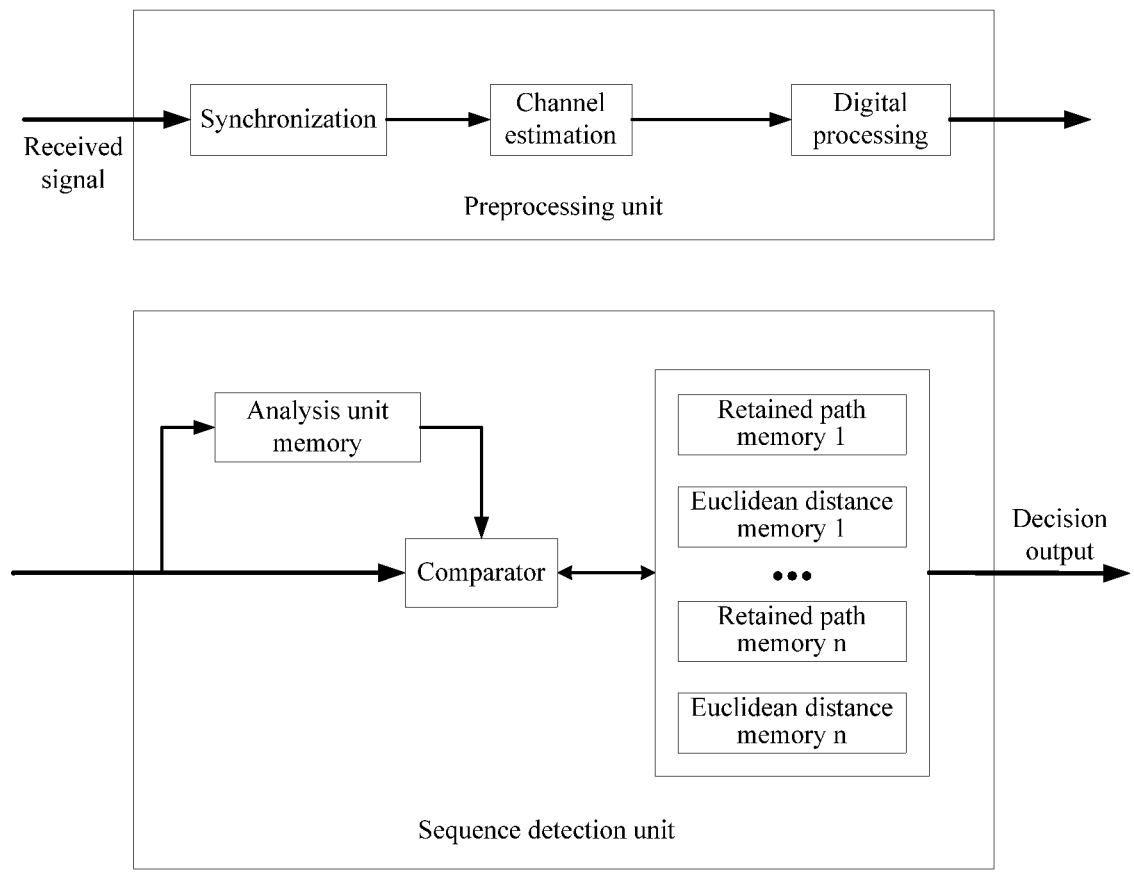
FIG. 17 is a schematic flowchart of a decoding step in an overlapped multiplexing-based demodulation method according to an embodiment of this application.

Referring to FIG. 17, in this embodiment, step 3.2 specifically includes the following sub steps:

(1) First, synchronize received signals, including carrier synchronization, frame synchronization, symbol time synchronization, and the like.

(2) Perform digital processing on received signals in each frame based on a sampling theorem.

(3) Cut a received waveform based on a waveform transmission time interval.

Figure 18:
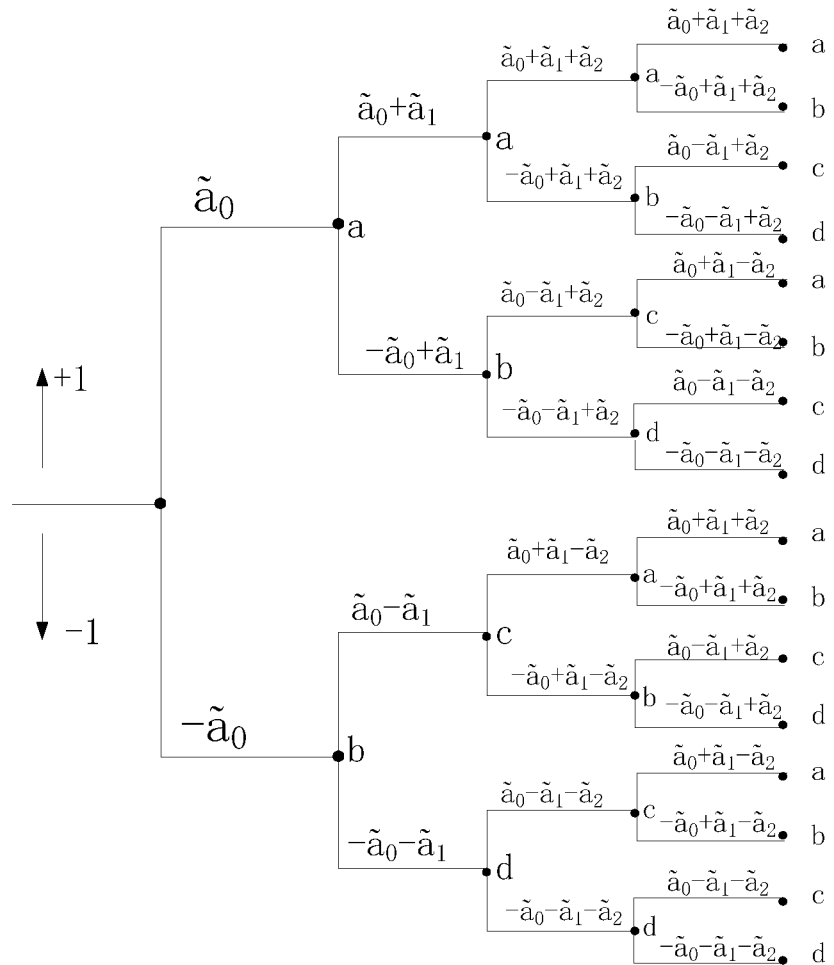
FIG. 18 is an input-output relationship tree diagram of an overlapped time division multiplexing system when K=3.
Figure 19:
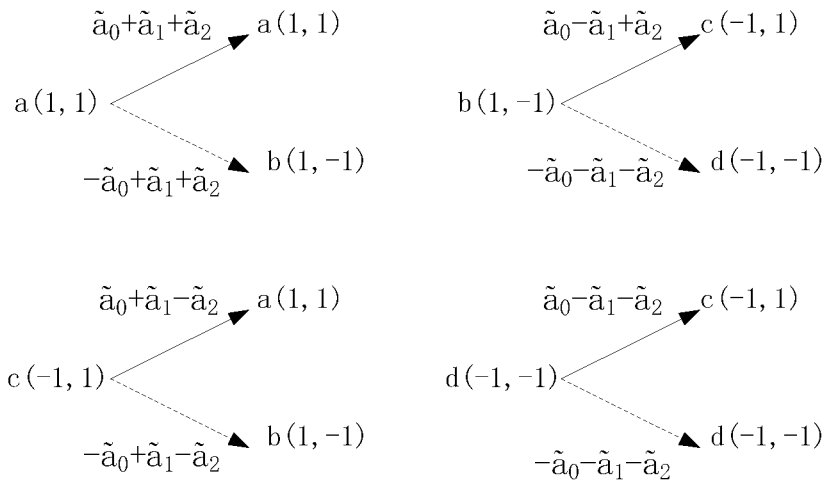
FIG. 19 is a node state transition diagram.
Figure 20:
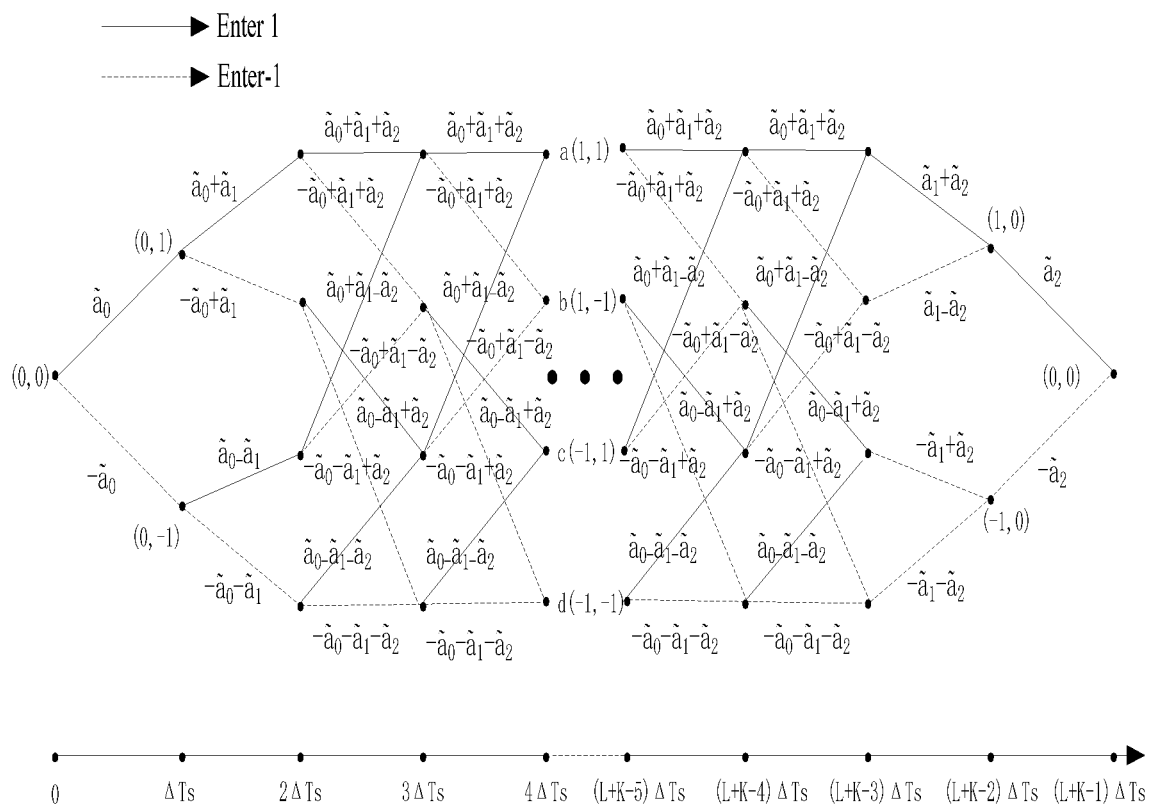
FIG. 20 is a trellis diagram of an OvTDM system when K=3.

(4) Decode the waveform obtained after cutting based on a decoding algorithm. For a decoding process, referring to FIG. 18, FIG. 18 is an input-output relationship diagram of overlapped time division when K=3. FIG. 19 is a node state transition diagram. FIG. 20 is a trellis diagram of an OvTDM system when K=3. Viterbi (Viterbi) decoding is a most widely used method in a convolutional code. A basic idea of the Viterbi decoding is: traversing all paths in the trellis diagram, comparing distances between a plurality of branches arriving at each state and a correct path in a state transition process in the trellis diagram, retaining only a path with a smallest distance, and obtaining an estimate of the correct path through comparison and screening, to implement decoding.

It should be noted that the overlapped multiplexing-based demodulation and decoding in step 3.2 may be performed by using the foregoing method, or may be performed in another feasible method in the prior art.

Figure 21:
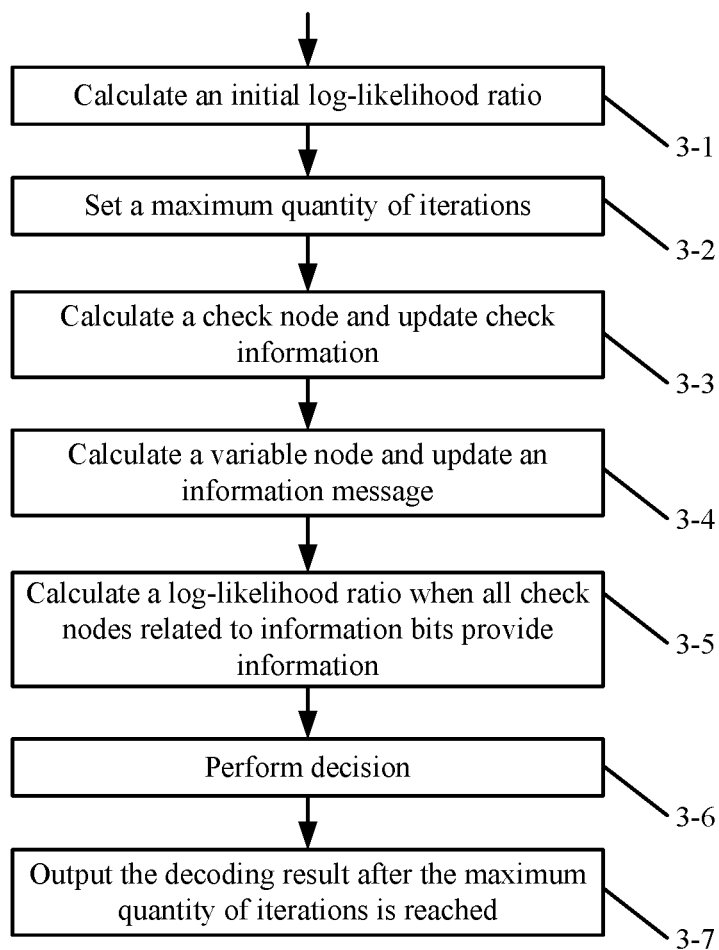
FIG. 21 is a schematic flowchart of a factor graph-based belief propagation decoding step in an overlapped multiplexing-based demodulation method according to an embodiment of this application.

Referring to FIG. 21, assuming that a noise variance obtained after digital signal processing is σ, and a sequence obtained after OvXDM-based decoding is $x_j \in \{+1, -1\}$, step 3.3. includes the following substeps:

Substep 3-1: Calculate an initial log-likelihood ratio.

Specifically, a result of a log-likelihood ratio is usually related to a modulation scheme, a decoding method of the OvXDM system (namely, the overlapped multiplexing-based demodulation and decoding method), and the like, with an ultimate objective to extract a soft value.

Substep 3-2: Set a maximum quantity of iterations.

Specifically, in this embodiment, a quantity of iterations is set to 50. When the quantity of iterations increases, a final decoded sequence is closer to an theoretical sequence. However, if the quantity of iterations is excessively large, algorithm complexity also correspondingly increases.

Substep 3-3: Calculate a check node and update check information.

Specifically, check nodes of each row and each column are calculated and updated based on a formula $$\delta_{ij} = 2\tanh^{-1}\left(\prod_{j' \in N(i) \setminus j} \tanh(\lambda_{j'i}/2)\right),$$

where Π is a continuous operation.

Substep 3-4: Calculate a variable node and update an information message.

Specifically, information messages of each row and each column are updated based on a formula $$\lambda_{ji} = llr(x_j) + \sum_{i' \in M(j) \setminus i} \delta_{i'j}.$$

Substep 3-5: Calculate a log-likelihood ratio when all check nodes related to information bits provide information.

Specifically, a new information message is calculated based on a formula $$\lambda_j = llr(x_j) + \sum_{i' \in M(j)} \delta_{i'j}.$$

Substep 3-6: Perform decision.

Specifically, in this embodiment, a hard decision manner and a BPSK modulation scheme are used. It is assumed that corresponding modulation mapping herein is 1→−1, 0→+1, that is, $$\hat{x}_j = \begin{cases} 0, & \lambda_j \geq 0 \\ 1, & \lambda_j < 0 \end{cases}.$$

Substep 3-7: Output the decoding result after a specific preset condition is satisfied. In this embodiment, the preset condition is that the maximum quantity of iterations is reached.

It is determined whether the maximum quantity of iterations is reached. If the condition is satisfied, current decoding ends, and the decoded sequence is output; otherwise, calculation is performed again, starting from substep 3-3. In this case, the information message $\lambda_{ji}$ is a result of a previous iteration operation.

Embodiment 3

Figure 22:
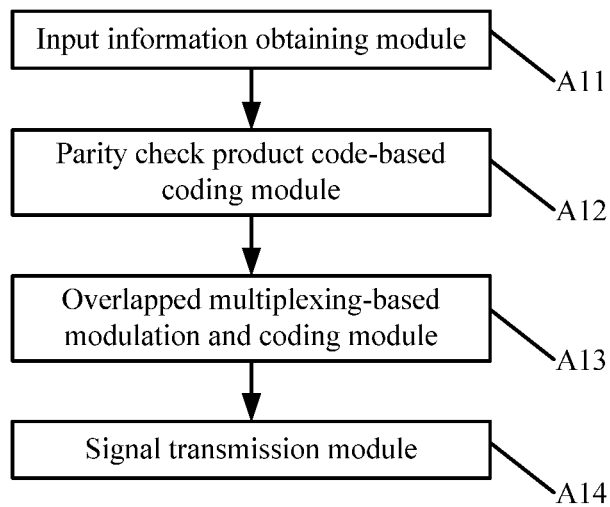
FIG. 22 is a schematic diagram of modules in an overlapped multiplexing-based modulation device according to an embodiment of this application.

Referring to FIG. 22, based on the overlapped multiplexing-based modulation method provided in Embodiment 1, this embodiment correspondingly provides an overlapped multiplexing-based modulation device, including an input information obtaining module A11, a parity check product code-based coding module A12, an overlapped multiplexing-based modulation and coding module A13, and a signal transmission module A14.

The input information obtaining module A11 is configured to obtain input information.

The parity check product code-based coding module A12 is configured to perform parity check product code-based coding on the input information.

The overlapped multiplexing-based modulation and coding module A13 is configured to perform overlapped multiplexing-based modulation and coding.

The signal transmission module A14 is configured to transmit a coded signal.

Figure 23:
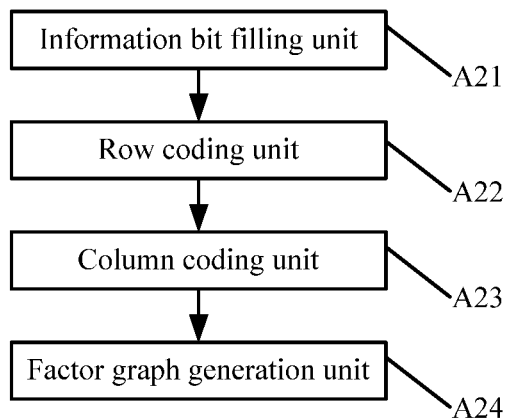
FIG. 23 is a schematic diagram of units of a parity check product code-based coding module in an overlapped multiplexing-based modulation device according to an embodiment of this application.

Referring to FIG. 23, in this embodiment, the parity check product code-based coding module A12 includes an information bit filling unit A21, a row coding unit A22, a column coding unit A23, and a factor graph generation unit A24.

The information bit filling unit A21 is configured to fill the input information into information bits in a coding structure. The coding structure may be a diagonal coding structure, a two-dimensional coding structure, a three-dimensional coding structure, or four-dimensional coding structure, or a higher-dimensional coding structure. This embodiment is described by using the two-dimensional coding structure as an example.

Specifically, the information bit filling unit is configured to write an input information sequent into corresponding information bits according to a $k_c \times k_r$ two-dimensional structure, where a length of the input information is $N=k_c \times k_r$, where $k_r$ represents a quantity of rows, and $k_c$ represents a quantity of columns.

The row coding unit A22 is configured to perform row coding on the information in the information bits. Specifically, the row coding unit is configured to perform row coding by assuming that information in the $(k_r+1)^{th}$ bit of each row is a modulo-2 addition result of the first $k_c^{th}$ columns of the current row.

The column coding unit A23 is configured to perform column coding on the information in the information bits. Specifically, the column coding unit is configured to perform column coding by assuming that information in the $(k_c+1)^{th}$ bit of each column is a modulo-2 addition result of the first $k_r^{th}$ rows of the current column.

The factor graph generation unit A24 is configured to generate a factor graph for a coding result according to a coding rule.

The overlapped multiplexing-based modulation device provided in this embodiment is corresponding to the overlapped multiplexing-based modulation method provided in Embodiment 1. Therefore, a principle of the device is not described in detail herein.

Embodiment 4

Figure 24:
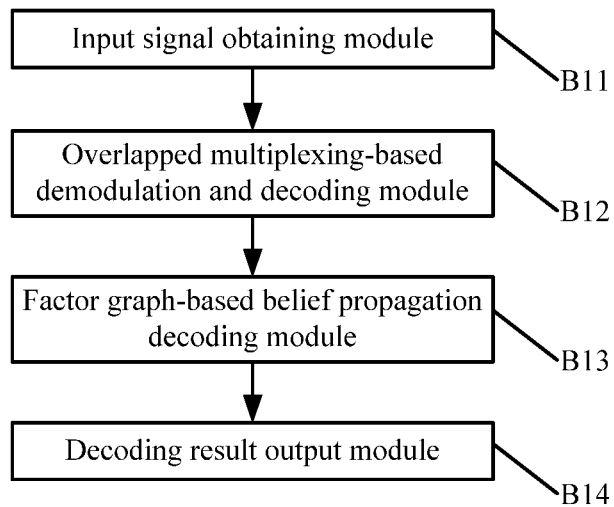
FIG. 24 is a schematic diagram of modules in an overlapped multiplexing-based demodulation device according to an embodiment of this application.

Referring to FIG. 24, based on the overlapped multiplexing-based demodulation method provided in Embodiment 2, this embodiment correspondingly provides an overlapped multiplexing-based demodulation device, including an input signal obtaining module B11, an overlapped multiplexing-based demodulation and decoding module B12, a factor graph-based belief propagation decoding module B13, and a decoding result output module B14.

The input signal obtaining module B11 is configured to obtain an input signal.

The overlapped multiplexing-based demodulation and decoding module B12 is configured to perform overlapped multiplexing-based demodulation and decoding on the input signal.

The factor graph-based belief propagation decoding module B13 is configured to perform factor graph-based belief propagation decoding.

The decoding result output module B14 is configured to output a decoding result.

Figure 25:
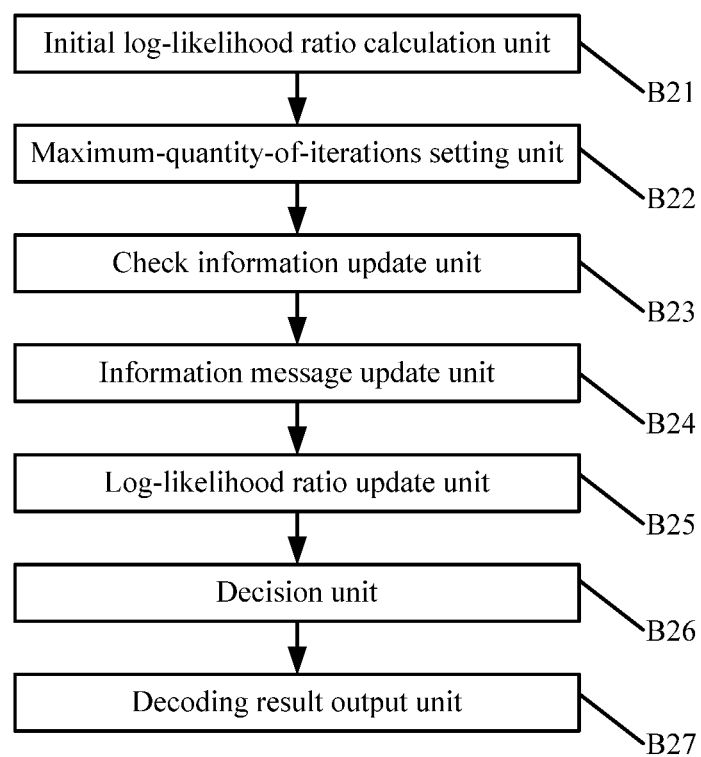
FIG. 25 is a schematic diagram of units of a factor graph-based belief propagation decoding module in an overlapped multiplexing-based demodulation device according to an embodiment of this application.

Referring to FIG. 25, in this embodiment, the factor graph-based belief propagation decoding module B13 includes an initial log-likelihood ratio calculation unit B21, a maximum-quantity-of-iterations setting unit B22, a check information update unit B23, an information message update unit B24, a log-likelihood ratio update unit B25, a decision unit B26, and a decoding result output unit B27.

The initial log-likelihood ratio calculation unit B21 is configured to calculate an initial log-likelihood ratio.

The maximum-quantity-of-iterations setting unit B22 is configured to set a maximum quantity of iterations.

The check information update unit B23 is configured to calculate a check node and update check information.

The information message update unit B24 is configured to calculate a variable node and update an information message.

The log-likelihood ratio update unit B25 is configured to calculate a log-likelihood ratio when all check nodes related to information bits provide information.

The decision unit B26 is configured to perform decision.

The decoding result output unit B27 is configured to output the decoding result after a specific preset condition is satisfied. The preset condition may be that the maximum quantity of iterations is reached.

Specifically, in this embodiment, a hard decision manner and a BPSK modulation scheme are used. It is assumed that corresponding modulation mapping herein is 1→−1, 0→+1, that is, $$\hat{x}_j = \begin{cases} 0, & \lambda_j \geq 0 \\ 1, & \lambda_j < 0 \end{cases}.$$

In an embodiment, the check information update unit B23 is configured to calculate the check node by using a formula $$\delta_{ij} = 2\tanh^{-1}\left(\prod_{j' \in N(i)\setminus j} \tanh(\lambda_{j'i}/2)\right) \text{ or } \delta_{ij} = \min(|\lambda_{j'i}|)\left(\prod_{j' \in N(i)\setminus j} \text{sign}(\lambda_{j'i})\right),$$

and update the check information, where $\delta_{ij}$ is the check information, and represents a log-likelihood ratio when other variable nodes except the $j^{th}$ variable node provide information; $\lambda_{j'i}$ is the information message, and represents a log-likelihood ratio when other check nodes except the $i^{th}$ check node provide information; N(i) is a partial element information set constrained by the check node; N(i)\j represents a subset of N(i) that does not include the $j^{th}$ variable node; and Π is a continuous multiplication operation.

The information message update unit B24 is configured to calculate the variable node by using a formula $$\lambda_{ji} = llr(x_j) + \sum_{i' \in M(j)\setminus i} \delta_{i'j},$$

and update the information message.

The log-likelihood ratio update unit B25 is configured to calculate the log-likelihood ratio when all the check nodes related to the information bits provide information by using a formula $$\lambda_j = llr(x_j) + \sum_{i' \in M(j)} \delta_{i'j},$$

where $x_j$ is a transmit codeword in a transmit signal of a transmitter; $y_j$ is a receive codeword in the input signal received by a receiver; M(j) is a check set in which the variable node participates; M(j)\i represents a subset of the M(j) that does not include the $i^{th}$ check node; $\delta_{i'j}$ is the check information, and represents a log-likelihood ratio when other variable nodes except the $j^{th}$ variable node provide information; $llr(x_j)$ is a representation form of a log-likelihood ratio when the receiver initially receives channel information; $\lambda_{ji}$ is the information message, and represents a log-likelihood ratio when other check nodes except the $i^{th}$ check node provide information; and $\lambda_j$ represents the log-likelihood ratio when all the check nodes related to the information bits provide information.

The overlapped multiplexing-based demodulation device provided in this embodiment is corresponding to the overlapped multiplexing-based demodulation method provided in Embodiment 2. Therefore, a principle of the device is not described in detail herein.

The embodiments of this application provide the overlapped multiplexing-based modulation and demodulation method and device. In the modulation method, a precoding structure is used, and a transmit end first performs parity check product code-based coding on an input information sequence, then performs overlapped multiplexing-based modulation and coding, and transmits a coded signal by using an antenna. In the demodulation method, a signal is transmitted by using a channel, and after receiving the signal by using an antenna, a receive end first performs digital signal processing, including processes such as synchronization and equalization, then performs overlapped multiplexing-based demodulation and decoding, and finally performs factor graph-based belief propagation decoding on a decoding result, to finally obtain a decoded sequence. In this application, a product code-based decoding method is used, a parity check code is used as a subcode, and a belief propagation idea of a factor graph is applied to a decoder end. Therefore, a parity check product code in a simple structure is used. In addition, in the method, the factor graph is used in a decoding process, thereby reducing operation complexity.

It should be noted that the overlapped multiplexing-based modulation and demodulation method and device provided in the embodiments of this application may be applied to wireless communications systems such as mobile communications, satellite communications, microwave line-of-sight communications, scatter communications, atmospheric optical communications, infrared communications, and underwater acoustic communications systems; and may be applied to both large-capacity wireless transmission and small-capacity lightweight radio systems.

A person skilled in the art may understand that all or some of the steps of the methods in the foregoing implementations may be implemented by a program controlling related hardware. The program may be stored in a computer-readable storage medium. The storage medium may include a read-only memory, a random access memory, a magnetic disk, an optical disk, or the like.

The foregoing content is a further detailed description of this application with reference to specific embodiments, and it should not be considered that specific implementation of this application is limited only to the description. A person of ordinary skill in the technical field to which this application belongs may further make simple derivations or replacements without departing from the inventive concept of this application.

What is claimed is:

1. An overlapped multiplexing-based modulation method, comprising:
   obtaining input information;
   performing parity check product code-based coding on the input information, to generate a factor graph;
   performing overlapped multiplexing-based modulation and coding; and
   transmitting a coded signal;
   wherein the performing parity check product code-based coding on the input information comprises:

filling the input information into information bits in a coding structure;
performing row coding on the information in the information bits;
performing column coding on the information in the information bits; and
generating the factor graph for a coding result according to a coding rule;
wherein the performing parity check product code-based coding on the input information further comprises:
writing an input information sequent into corresponding information bits according to a $k_c \times k_r$ two-dimensional structure, wherein a length of the input information is $N=k_c \times k_r$, wherein $k_r$ represents a quantity of rows, and $k_c$ represents a quantity of columns;
performing row coding by assuming that information in the $(k_r+1)^{th}$ bit of each row is a modulo-2 addition result of the first $k_c^{th}$ columns of the current row;
performing column coding by assuming that information in the $(k_c+1)^{th}$ bit of each column is a modulo-2 addition result of the first $k_r^{th}$ rows of the current column; and
generating the factor graph for the coding result according to the coding rule.

2. The method according to claim 1, wherein the coding structure is a diagonal coding structure, a two-dimensional coding structure, a three-dimensional coding structure, or a four-dimensional coding structure.

3. An overlapped multiplexing-based demodulation method, comprising:
obtaining an input signal;
performing overlapped multiplexing-based demodulation and decoding on the input signal;
performing factor graph-based belief propagation decoding; and
outputting a decoding result;
wherein the performing factor graph-based belief propagation decoding comprises:
calculating an initial log-likelihood ratio;
setting a maximum quantity of iterations;
calculating a check node and updating check information;
calculating a variable node and updating an information message;
calculating a log-likelihood ratio when all check nodes related to information bits provide information;
performing decision; and
outputting the decoding result after a specific preset condition is satisfied.

4. The method according to claim 3, comprising: calculating the check node by using a formula $$\delta_{ij} = 2\tanh^{-1}\left(\prod_{j' \in N(i) \setminus j} \tanh(\lambda_{j'i}/2)\right) \text{ or } \delta_{ij} = \min(|\lambda_{j'i}|)\left(\prod_{j' \in N(i) \setminus j} \text{sign}(\lambda_{j'i})\right),$$

and updating the check information, wherein $\delta_{ij}$, is the check information, and represents a log-likelihood ratio when other variable nodes except the $j^{th}$ variable node provide information; $\lambda_{j'i}$, the information message, and represents a log-likelihood ratio when other check nodes except the $i^{th}$ check node provide information; $N(i)$ is a partial element information set constrained by the check node; $N(i) \setminus j$ represents a subset of $N(i)$ that does not comprise the $j^{th}$ variable node; and $\Pi$ is a continuous multiplication operation; and/or
the preset condition is that the maximum quantity of iterations is reached.

5. The method according to claim 3, comprising:
calculating the variable node by using a formula $$\lambda_{ji} = llr(x_j) + \sum_{i' \in M(j) \setminus i} \delta_{i'j},$$

and updating the information message; and
calculating the log-likelihood ratio when all the check nodes related to the information bits provide information by using a formula $$\lambda_j = llr(x_j) + \sum_{i' \in M(j)} \delta_{i'j},$$

wherein
$x_j$ is a transmit codeword in a transmit signal of a transmitter; $y_j$ is a receive codeword in the input signal received by a receiver; $M(j)$ is a check set in which the variable node participates; $M(j) \setminus i$ represents a subset of the $M(j)$ that does not comprise the $i^{th}$ check node; $\delta_{ij}$ is the check information, and represents a log-likelihood ratio when other variable nodes except the $j^{th}$ variable node provide information; $llr(x_j)$ is a representation form of a log-likelihood ratio when the receiver initially receives channel information; $\lambda_{ji}$ the information message, and represents a log-likelihood ratio when other check nodes except the $i^{th}$ check node provide information; and $\lambda_j$ represents the log-likelihood ratio when all the check nodes related to the information bits provide information.

6. An overlapped multiplexing-based modulation device, which comprises a hardware processor and a memory, and the hardware processor is configure to executed programming modules stored in the memory, and the programming modules comprising:
an input information obtaining module, configured to obtain input information;
a parity check product code-based coding module, configured to perform parity check product code-based coding on the input information;
an overlapped multiplexing-based modulation and coding module, configured to perform overlapped multiplexing-based modulation and coding; and
a signal transmission module, configured to transmit a coded signal;
the parity check product code-based coding module is further configured to:
write an input information sequent into corresponding information bits according to a $k_c \times k_r$ two-dimensional structure, wherein a length of the input information is $N=k_c \times k_r$, wherein $k_r$ represents a quantity of rows, and $k_c$ represents a quantity of columns;
perform row coding by assuming that information in the $(k_r+1)^{th}$ bit of each row is a modulo-2 addition result of the first $k_c^{th}$ columns of the current row;
perform column coding by assuming that information in the $(k_c+1)^{th}$ bit of each column is a modulo-2 addition result of the first $k_r^{th}$ rows of the current column; and
generate the factor graph for the coding result according to the coding rule.

7. The overlapped multiplexing-based demodulation device according to claim 6, the programming modules further comprising:

a second input signal obtaining module, configured to obtain an input signal;

an overlapped multiplexing-based demodulation and decoding module, configured to perform overlapped multiplexing-based demodulation and decoding on the input signal;

a factor graph-based belief propagation decoding module, configured to perform factor graph-based belief propagation decoding; and a decoding result output module, configured to output a decoding result;

wherein the factor graph-based belief propagation decoding module is further configured to:

calculate an initial log-likelihood ratio;

set a maximum quantity of iterations;

calculate a check node and updating check information;

calculate a variable node and updating an information message;

calculate a log-likelihood ratio when all check nodes related to information bits provide information;

perform decision; and output the decoding result after a specific preset condition is satisfied.

\* \* \* \* \*